US010779402B1

(12) United States Patent
Ng et al.

(10) Patent No.: US 10,779,402 B1
(45) Date of Patent: Sep. 15, 2020

(54) NOISE SENSITIVE TRACE 3D GROUND-SHIELDING CROSSTALK MITIGATION

(71) Applicant: Intel Corporation, Santa Clara, CA (US)

(72) Inventors: Kai Chong Ng, Butterworth (MY); Natasya Athirah Abdul Khalid, Bayan Lepas (MY); Florence Su Sin Phun, Gelugor (MY); Yee Hung See Tau, Gelugor (MY); Asmah Truky, Bayan Lepas (MY); Ying Ern Ho, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/402,992

(22) Filed: May 3, 2019

(51) Int. Cl.
*H05K 1/02* (2006.01)
*H01L 23/498* (2006.01)
*G06F 1/10* (2006.01)

(52) U.S. Cl.
CPC ............. *H05K 1/0284* (2013.01); *G06F 1/10* (2013.01); *H01L 23/49827* (2013.01); *H05K 1/0216* (2013.01)

(58) Field of Classification Search
CPC ............. H05K 1/0215–0228; H05K 2201/093
See application file for complete search history.

(56) References Cited

U.S. PATENT DOCUMENTS

| | | | |
|---|---|---|---|
| 2004/0040739 A1* | 3/2004 | Yoshimura | H05K 1/0221 174/255 |
| 2006/0146484 A1* | 7/2006 | Kim | H05K 1/0219 361/600 |
| 2007/0120231 A1* | 5/2007 | Kobayashi | H05K 1/0219 257/662 |
| 2007/0221405 A1* | 9/2007 | Cheng | H05K 1/0219 174/265 |
| 2014/0197545 A1* | 7/2014 | Chase | H05K 1/0222 257/774 |
| 2016/0293554 A1* | 10/2016 | Tan | H01L 23/5385 |
| 2018/0287618 A1* | 10/2018 | Petrov | H05K 1/0225 |

* cited by examiner

*Primary Examiner* — Hoa C Nguyen
(74) *Attorney, Agent, or Firm* — Schwegman Lundberg & Woessner, P.A.

(57) ABSTRACT

A printed circuit board (PCB) includes a dielectric plane and a ground plane parallel to and spaced apart from the dielectric plane. The dielectric plane includes a pair of signal traces and a 3-dimensional (3D) grounded (GND) fence located between the pair of signal traces. The 3D GND fence is electrically connected to the ground plane, and protrudes perpendicularly from the dielectric plane. The 3D GND fence is located equidistant from each of the pair of signal traces, and the 3D GND fence is configured to block electromagnetic interference (EMI) from a first of the pair of signal traces to a second of the pair of the signal traces. The pair of signal traces is configured to form part of a noise-sensitive electronic circuit. The 3D GND fence may have a rectangular configuration.

18 Claims, 8 Drawing Sheets

NOISE SENSITIVE TRACE 3D GROUND-SHIELDING CROSSTALK MITIGATION

PRIORITY

This application claims the benefit of priority to Malyasian Application Serial Number PI 2018702168, filed Jun. 4, 2018, which is incorporated herein by reference in its entirety.

TECHNICAL FIELD

The disclosure herein relates generally to structures to reduce crosstalk in small form factor circuitry and related methods therefor.

BACKGROUND

In some circuitry designs, particularly small form factor designs that include a crystal clock, signals are routed relatively near to each other and cause crosstalk noise coupling to the crystal network of the circuitry, degrading clock signals and, thus, the system performance. As printed circuit board area continues to shrink and bus speeds increase, crosstalk coupling will become more problematic and current solutions will not be efficient. Consequently, there is a need for improved mitigation of crosstalk in small form factor circuits.

DETAILED DESCRIPTION

In some circuit designs that include a crystal clock, signal coupling to the crystal network has been observed to result in increased the jitter on the crystal line. Such problems have been known to affect a display Phase-Locked Loop (PLL). This can ultimately cause issues such as screen flickering. Current solutions have been attempted in order to resolve such issues, but the observed resulting isolation was insufficient, even with large spacing applied for main routing with ground shielding. A signal trace is generally understood to mean a conductive line configured to be connected, or in some embodiments already connected, as part of electronic circuitry. Sensitive nets from a crystal clock are usually routed in signal traces such as stripline, surrounded with ground to provide good referencing and noise shielding from other sources to reduce crosstalk. However, the clock component in such circuits is usually placed on top of the PCB. Consequently, top layer microstrip routings are often unavoidable. This exposes the nets to greater crosstalk impact. Current solutions include a full 2D ground (GND) trace at the edge of the board to protect the crystal clock network. A minimum trace width is required that would mean a minimum amount of area needed for such implementations. Another current solution is to increase the spacing between the network and the signal lanes to minimize the interaction of the electromagnetic field with the adjacent conductors. Similarly, this would require trade-offs with the PCB real estate and signal performance. The disclosed subject matter relates to three dimensional (3D) ground (GND) fence-shielding to suppress electromagnetic (EM) crosstalk issues by using Z-height along GND traces as an improvement to prior crosstalk mitigation solutions. In some embodiments, the Z-height can be targeted to be as much as the maximum distance available in the Z dimension. In some embodiments the Z-height is targeted to be no more than the height of the highest component on the board, so as not to add additional Z-height.

Figure 1:
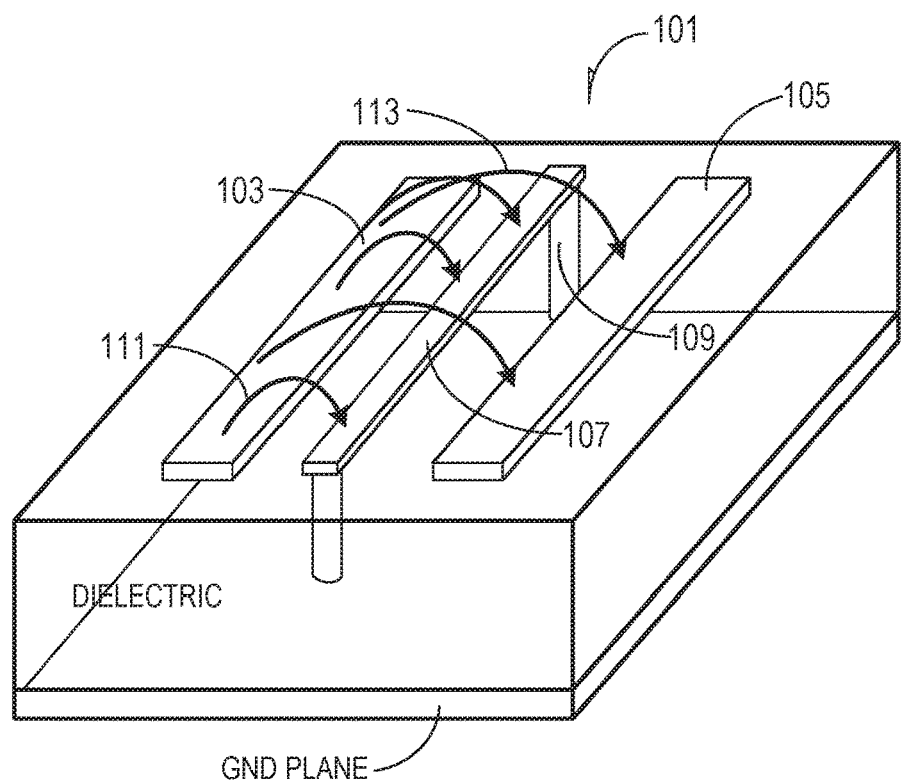
FIG. 1 broadly illustrates a two dimensional (2D) ground (GND) trace in a noise-sensitive electronic network.

Generally speaking, crosstalk is an undesired phenomena caused by the EM coupling between the PCB traces. FIG. 1 broadly illustrates a two dimensional (2D) GND trace in a sensitive noise-sensitive electronic network. For sensitive nets such as a crystal network, the conventional 2D GND trace implementation seen generally at 101 is used to shield the signals. For example, signal trace 103 is the aggressor trace (meaning the trace from which electromagnetic interference (EMI) originates) which may cause crosstalk to victim signal trace 105 (meaning the trace which experiences crosstalk from aggressor trace 103, according to some embodiments). Crosstalk, or EMI, is indicated symbolically by arrows, two of which are enumerated 111, 113. 2D GND trace 107, connected to ground by way of a number of vias in some embodiments, one of which is enumerated 109, mitigates crosstalk. In some embodiments the vias are through-semiconductor vias. Typically, this 2D GND tracing has substantially the same Z-height as the neighboring signal traces, here 103, 105. Some, or in some embodiments, most, of the crosstalk is collected or attached by the 2D GND trace 107, as indicated by arrows attracted to the 2D GND 107. However, some of the EM field from the aggressor trace 103 could still be coupled to the neighboring victim trace 105 via the Z-direction and can still cause crosstalk as indicated by arrows proceeding over 2D GND trace 107, one of which is enumerated 113. The impact increases as both the aggressor trace 103 and the victim trace 105 are placed closer to each other. The effectiveness of 2D GND trace isolation is typically up to −40 dB, which is generally insufficient to meet some of the current and expected stringent Phase-Locked Loop (PLL) jitter requirements and, thus, will directly impact some high frequency applications. Additionally, with the area constraint in Small Form Factor (SFF) design, the signal routing would be more congested. Consequently, there would be little or no additional room for area trade-offs. With current and future reduced PCB area, the 2D GND trace that surrounds the crystal network has been found to be insufficient to reduce the crosstalk and the EMI risk to the extent desired or needed.

Figure 2:
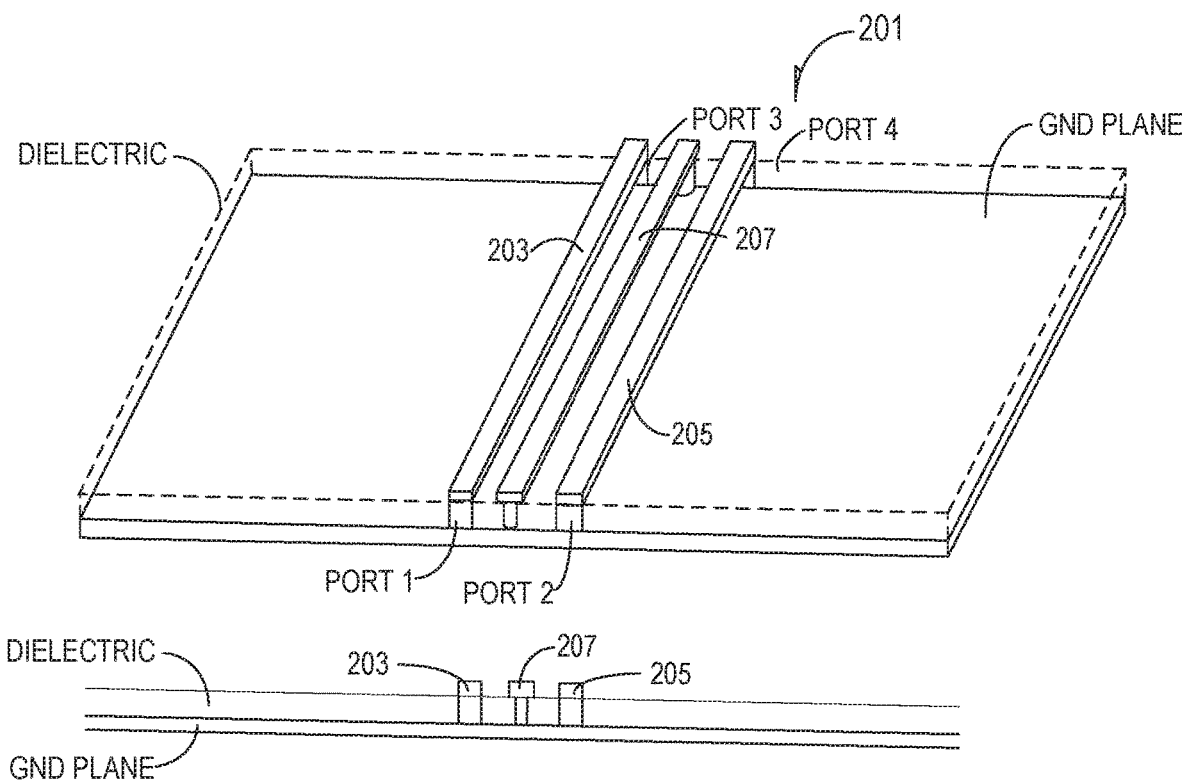
FIGS. 2 and 2A illustrate the 2D GND trace of FIG. 1 in additional detail, according to some embodiments.
Figure 2A:
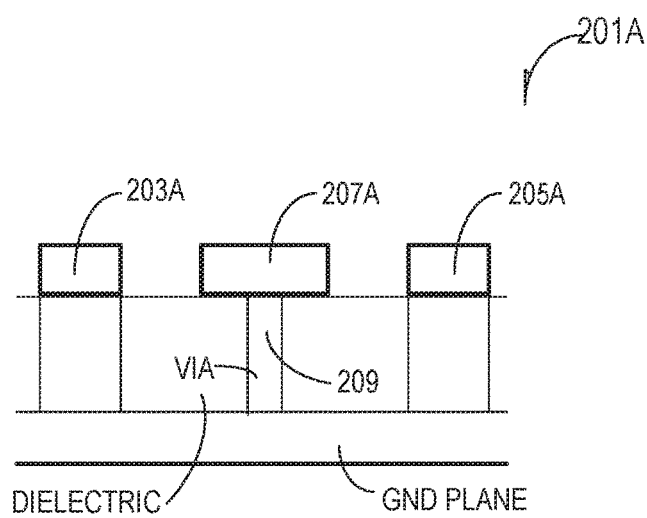

FIGS. 2 and 2A illustrate the 2D GND trace of FIG. 1 in additional detail, according to some embodiments. FIGS. 2 and 2A represent the concept of the conventional 2D GND trace implementation. FIG. 2 illustrates the 2D GND trace in perspective view 201. 2D fence 207 is between aggressor trace 203 and victim trace 205 to reduce crosstalk between trace 203 and 205. In FIG. 2A, 2D GND trace 201A is illustrated in side view, again between aggressor trace 203A and victim trace 205A, to reduce crosstalk between trace 203A and trace 205A. As can be seen in greater detail in the side view 201A, aggressor trace 203A, 2D GND trace 207A and victim trace 205A are seen to be at the same level with respect to the top of the dielectric. 2D GND trace 207A is illustrated as connected to ground by way of one or more vias in this embodiment. In this embodiment the via is illustrated as having a diameter less than the width of the 2D GND trace. In other embodiments the trace width and the via width could have the same geometry. Further, both trace width and via size will not appreciably impact the results achieved.

Figure 1A:
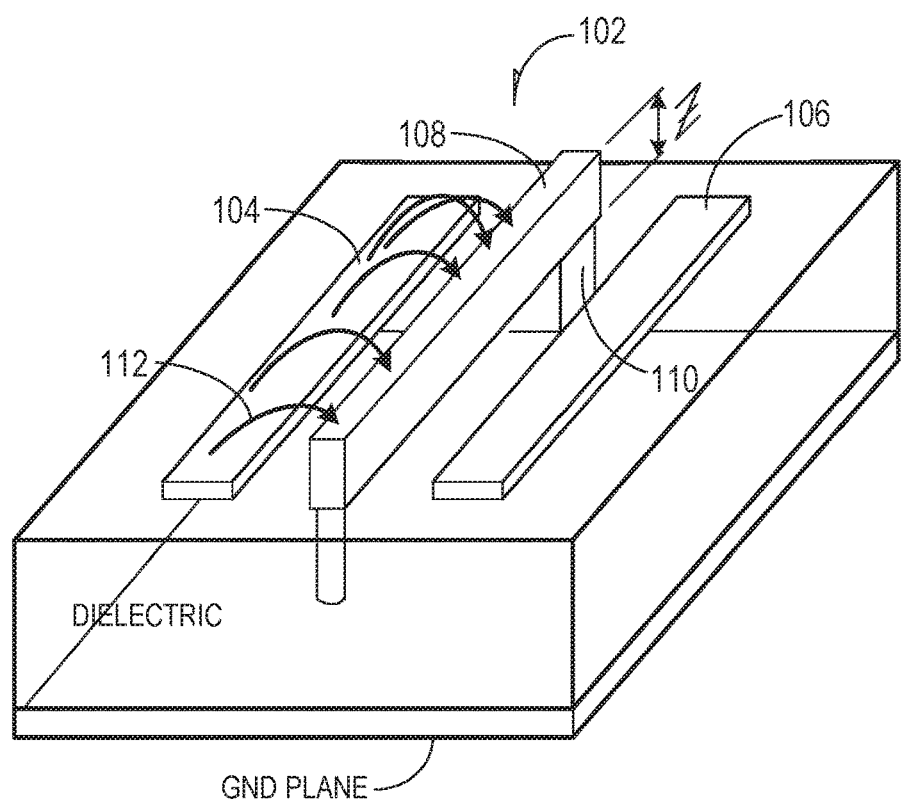
FIG. 1A broadly illustrates a protruded three dimensional (3D) GND fence structure in a noise-sensitive electronic network, according to some embodiments.

FIG. 1A broadly illustrates a protruded three dimensional (3D) GND fence structure in a noise-sensitive electronic network, according to some embodiments. In some embodiments, aggressor trace 104 may cause crosstalk to victim trace 106. Crosstalk, or EMI is again indicated symbolically by the arrows. Protruded 3D GND trace 108, which extends above the level (or height) of traces 104, 106, is therefore considered 3D, because of using the indicated Z-height. The protruded 3D GND trace 108 of FIG. 1A is also above the level (or height) of 2D GND trace 107 of FIG. 1. The protruded 3D GND fence 108 may therefore be referred to as 3D GND fence shielding. Protruded 3D GND fence shielding 108 is in some embodiments connected to the GND plane by way of vias such as 110. Most, if not all, of the crosstalk such as arrow 112 is collected or attracted by the 3D GND fence 108. Improved 3D GND fence-shielding has been found to suppress the EMI coupling by utilizing Z-height along the GND trace. With limitations in the X-Y area, the 3D GND "fence" structure can be constructed to reduce the noise coupling in the Z-direction. In other words, the thickness of the ground trace, or the Z-height, is increased, assembling a "ground fence" structure to further block the EM field of the aggressor trace 104 from coupling to the victim trace 106. By doing so an improvement is achieved by the fact that both aggressor trace and victim trace can now be routed closer to each other in order to achieve a smaller form factor design, while meeting crosstalk requirements.

Figure 3:
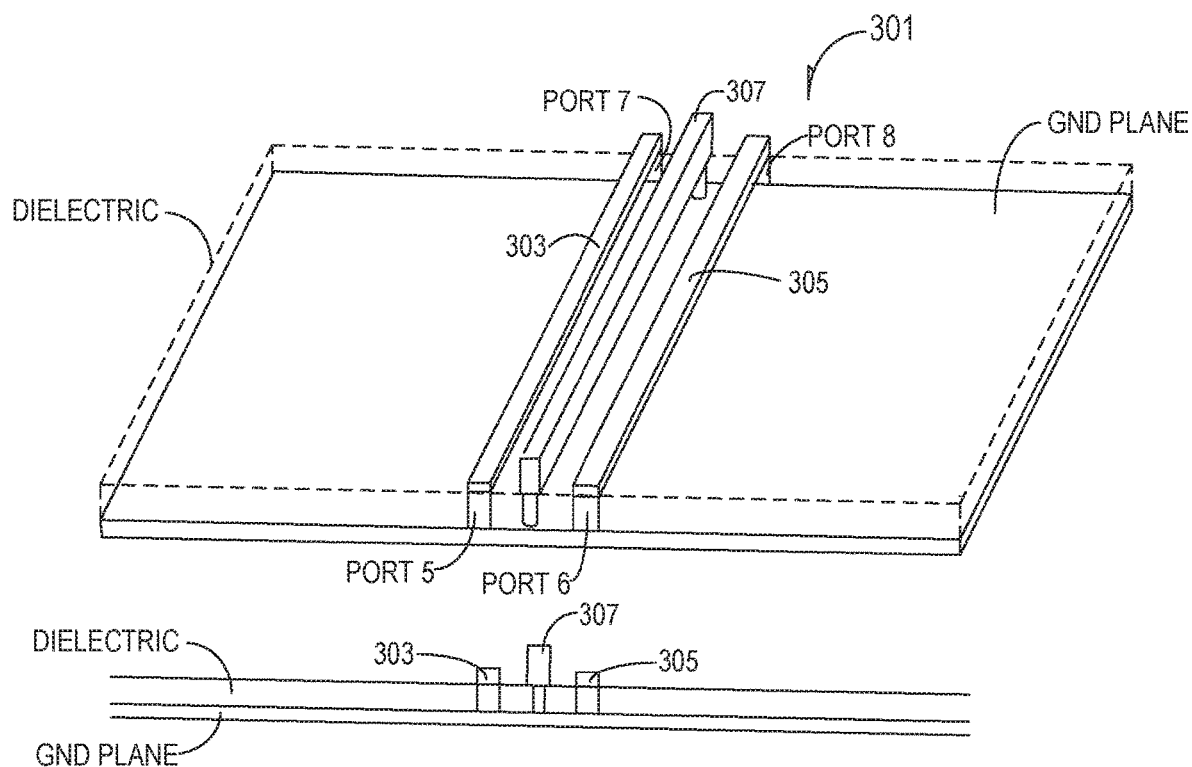
FIGS. 3 and 3A illustrate the 3D GND fence structure of FIG. 1A in additional detail, according to some embodiments.
Figure 3A:
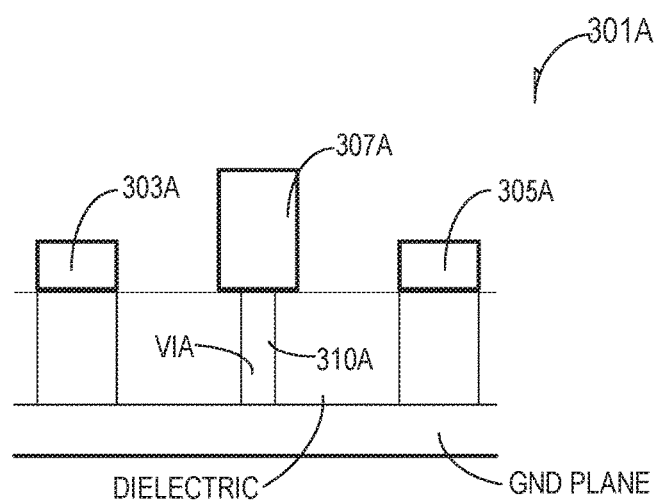

FIGS. 3 and 3A illustrate the 3D GND fence structure of FIG. 1A in additional detail, according to some embodiments. The 3D GND fence dimensions in some embodiments are width=125 um, with different Z-heights of 90 um and 120 um, as discussed below. FIG. 3 illustrates a 3D GND fence in perspective view 301. 3D GND fence 307 is between aggressor trace 303 and victim trace 305 to reduce crosstalk between traces 303 and 305. In FIG. 3A, 3D GND fence 301A is illustrated in side view, and illustrates the 3D GND fence 307A between aggressor trace 303A and victim trace 305A, to reduce crosstalk between trace 303A and trace 305A. As can be seen in greater detail in FIG. 3A the 3D GND fence 307A protrudes above the level of aggressor trace 303A and victim trace 305A with respect to the top of the dielectric. In side view 301, the GND plane and the dielectric are illustrated in additional detail, with the 3D GND fence 307A above the level of aggressor trace 303A and victim trace 305A, thus forming the fence illustrated symbolically in FIG. 1A. FIG. 3A also indicates that the 3D GND fence is connected to the GND plane by way of Via 310A. In other words, FIG. 3 illustrates that the disclosed subject matter comprises a protruded 3D GND fence 307 on top of the conventional 2D GND trace, where material for the 3D GND fence may be added in the selected area during the selective plating process. FIG. 3A also illustrates the increased Z-height of the 3D GND fence in more detail. The rest of the design of FIGS. 2 and 2A remains substantially the same in FIGS. 3, 3A but for the 3D fence that uses increased Z-height.

Figure 4:
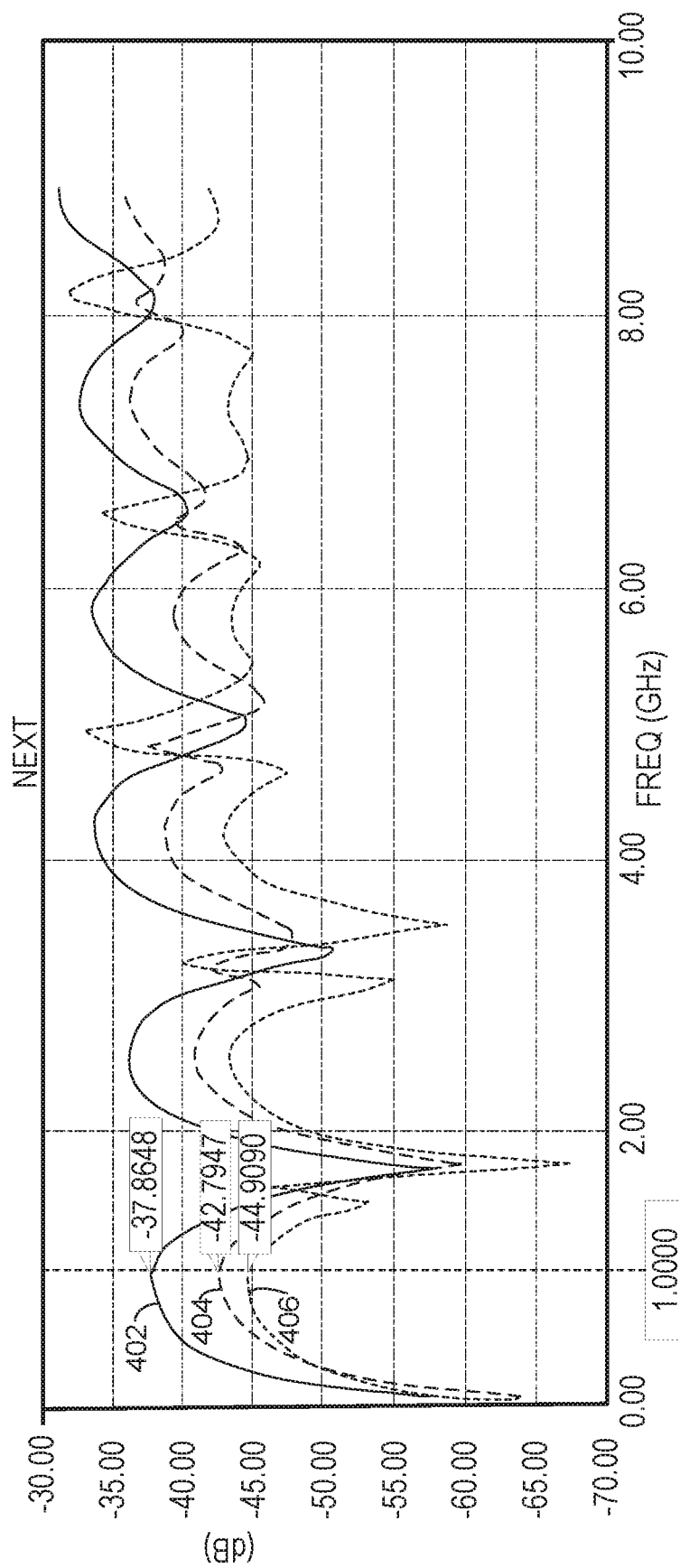
FIG. 4 is a graph showing decrease in Near End Crosstalk (NEXT) using a protruded 3D GND fence structure, according to some embodiments.
Figure 5:
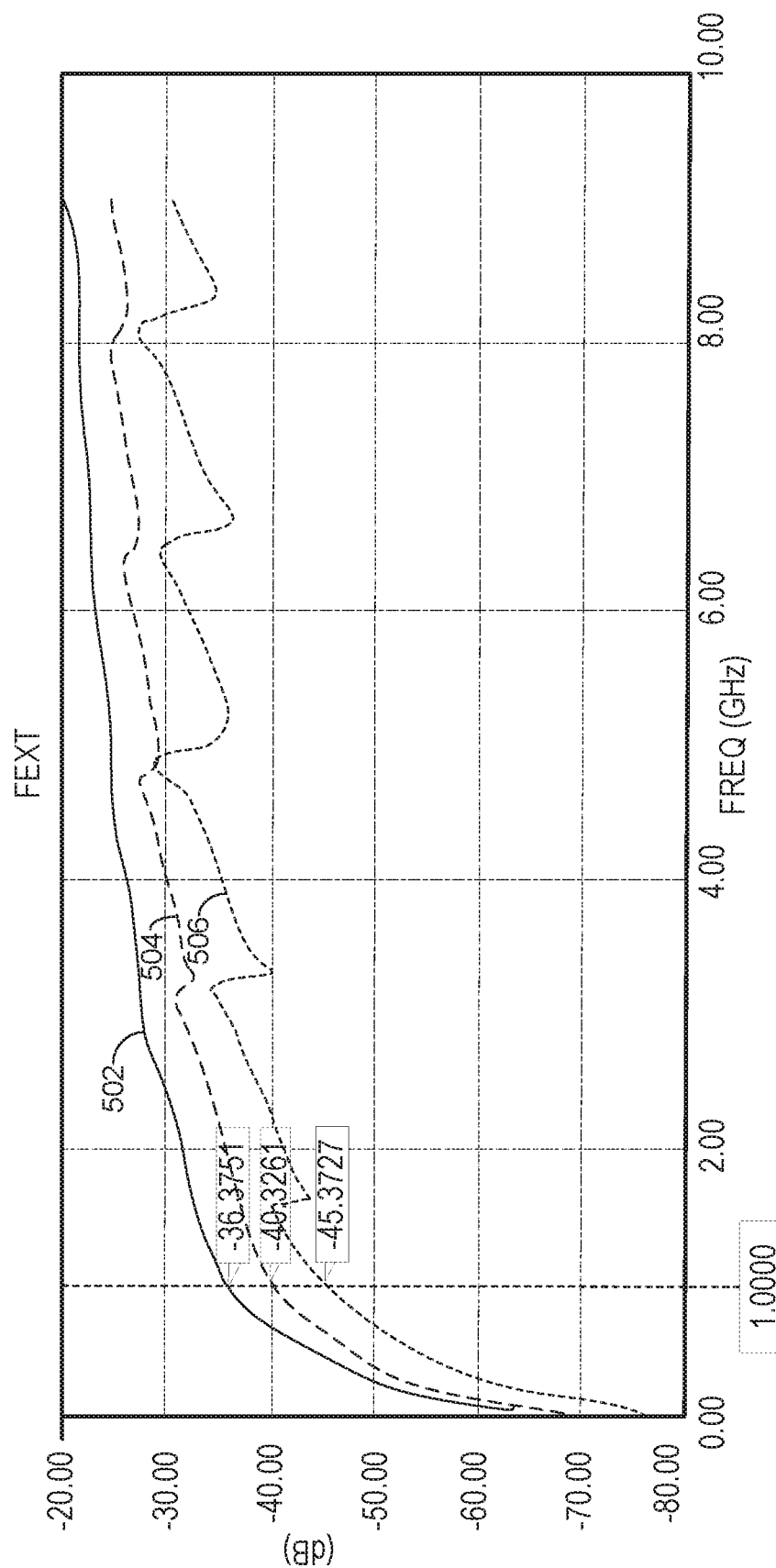
FIG. 5 is a graph showing decrease in Far End Crosstalk (FEXT) using a protruded 3D GND fence structure, according to some embodiments.

FIG. 4 is a graph showing decrease in Near End Crosstalk (NEXT) using a 3D GND fence structure, according to some embodiments. Simulation illustrates a comparison of the Near End Crosstalk (NEXT), the Far End Crosstalk (FEXT) and the Electric field (E-field) performance at the victim line. All the transmission line structures in the disclosed subject matter were solved for using HFSS 3D full-wave solver from 10 MHZ to 10 GHZ, with a 50 MHZ step size and solving frequency at 1 GHZ. In the setup simulations, excitation was induced on the aggressor trace, while the victim line was kept quiet, and the E-field was measured in Volts/meter. The results were probed at the victim line. FIG. 4 shows the results comparison of the NEXT, measuring isolation in dB as a function of frequency. Graph 402 indicates results using a 2D GND trace with a 30 μm thickness. In some embodiments, the aggressor and the victim trace are each the same height as the 2D GND trace, namely 30 um. Graph 404 indicates results using a 3D GND fence at Z-height of 90 μm. Graph 406 indicates results using a 3D GND fence with a Z-height of 120 μm. With a 30 μm increase of the 2D GND trace thickness, an approximately 5 dB improvement is seen (−42.7947 dB versus −37.8648 dB). By using a taller structure of 120 μm, an improvement of about 7 dB was obtained (−44.909-dB versus −37.8648 dB). FIG. 5 is a graph showing decrease in Far End Crosstalk (FEXT) using a 3D GND fence structure, according to some embodiments. Graph 502 indicates isolation results using a 2D GND trace. Graph 504 indicates results using a 3D GND fence at a Z-height of 90 μm. Graph 506 indicates results using a 3D GND fence at a Z-height of 120 μm. FEXT results show a similar performance trend as compared to the NEXT results. FIG. 5 shows that crosstalk improves by approximately 4 dB and approximately 5 dB, with an increased ground trace height of 30 μm and 120 μm, respectively.

Electric field (E-field) was also compared between 2D GND trace and 3D GND fence embodiments using the simulation setup described above for E-field measurements. Results comparing a conventional 2D GND trace to the disclosed 3D GND fence has shown that the EM field coupling from the aggressor trace to the victim trace is greatly reduced. The shielding effect was seen in simulation to be even better with further increased in Z-height. The simulation results again show that the protruding 3D GND will help suppress the resultant electric field coupling between the two conductors and, therefore, will ultimately enhance crosstalk immunity.

To obtain similar crosstalk improvement as that shown in FIGS. 4 and 5, by using the conventional 2D ground fence routing, would entail using three times the spacing between the aggressor and victim traces compared to that used with the 3D GND fence. Therefore, the disclosed subject matter has been shown by simulation to be very effective in mitigating the crosstalk impact, without contributing significant extra X and Y area routing in PCB design. These improvements from 3D GND fence-shielding over earlier crosstalk solutions can be summarized in Table 1 below.

TABLE I

| | |
|---|---|
| Improved noise immunity and EMI shielding | An improvement of 25% and 18.5% are achieved on both Far-End Crosstalk (FEXT) and Near-End Crosstalk (NEXT) respectively for the crystal network. The 'fence' structure also offers better EMI shielding in the Z-direction to further minimize the crosstalk and noise coupling to adjacent conductors. |
| Extended benefits to other noise sensitive applications | The 3D GND fence would also provide similar advantage to high speed bus applications such as High Speed Input/Output (HISO) and memory. The same principle could be applied ont he grounding that shield high speed trace busses. |
| Optimized SFF system design area | Instead of 3x spacing required to meet same crosstalk improvement, by populating Z-height on the 2D GND trace to form a 3D GND fence, it further enhances the small form factor system design area. |
| Feasible to SMT feature for component pad | With the growth of Surface Mount Technology (SMT), the need of microstrip routing is still valid for the component pad. |

Table 1, summarizes comparisons of observed results among a conventional 2D GND trace, a 3D GND fence with a first Z-height, and a 3D GND fence with an additional Z-height. PCB modeling was done on an implementation of the concept using ANSYS™ High Frequency Structure Simulator™ (HFSS).

The 2D ground trace 207, 207A of FIGS. 2 and 2A, respectively, having a 125 μm width and 30 μm height was placed in between a "victim" line indicated as Port 2, Port 4, of FIG. 2 and an "aggressor" line indicated as Port 1, Port3 in FIG. 2. The dimensions of the aggressor and victim signal lines are the same. The bottom metal plane is assigned as GND. The ground trace 207, 207A was electrically shorted to the GND plane by placing two conductive metal rods at both ends of the trace in HFSS simulation port assignment. The actual board implementation would not have these connections.

Similarly to the 2D GND trace case, the protruding 3D GND fence 307, 307A of FIGS. 3 and 3A, also having a 125 μm width and 90 μm height was placed in between a "victim" line or trace indicated as Port 6, Port 8, of FIG. 3, and an "aggressor" line or trace indicated as Port 5, Port 6 in FIG. 2. The dimensions of the aggressor and victim signal lines are the same. The bottom metal plane is assigned as GND. The 3D GND fence 307, 307A was electrically shorted to the GND plane by placing two conductive metal rods at both ends of the 3D GND fence in simulation.

Aggregated isolation results are seen in Table 2, below. The second row of Table 2 indicates an example of the different spacing that is needed to achieve similar results as the 3D Ground Fence, with the conventional 2D Ground trace (2.25× and 3.5×).

TABLE 2

| Case | Trace Height (μm) | NEXT @ 1 GHz (dB) | FEXT @ 1 GHz (dB) |
|---|---|---|---|
| Conventional 2D Ground | 30 | −37.86 | −36.38 |
| Conventional 2D Ground with increased spacing | 30 | 2.25x (−44.9) | 3.5x (−45.4) |
| 3D Ground Fence | 90 | −42.79 | −40.33 |
| 3D Ground Fence with additional height | 120 | −44.90 | −45.37 |

Figure 6:
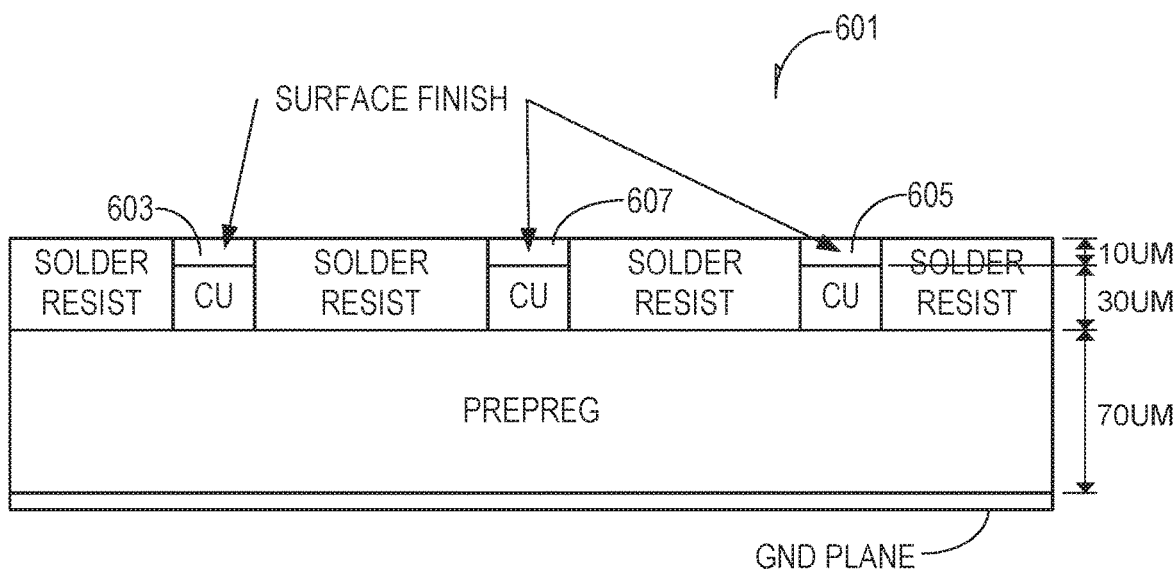
FIG. 6 illustrates a standard printed circuit board (PCB) manufacturing process with a standard surface finish.

FIG. 6 illustrates standard printed circuit board (PCB) manufacturing process 601 with a standard surface finish for a 2D GND trace implementations, with the dimensions representing dimensions of an embodiment. Prepreg is illustrated in this embodiment as 70 um in height, with the ground plane below the Prepreg. The aggressor trace and the victim trace are illustrated at 603, 605, respectively. The 2D GND trace is illustrated at 607. Each is a copper trace with surface finish having a depth as may be appropriate for an embodiment. The disclosed 3D GND fence can be manufactured using standard PCB manufacturing technology, through additional process steps of selective plating during the surface finish process of FIG. 6, according to some embodiments. In this case, the spacing between the traces 603, 605 would be the spacing for a 3D GND fence that will be built on top of the 2D GND trace. The GND plane is as illustrated and 603, 605, 607 may be connected to the GND plane as in FIGS. 2, 2A, but the connections are not shown in FIG. 6, for the purpose of clarity.

Figure 7:
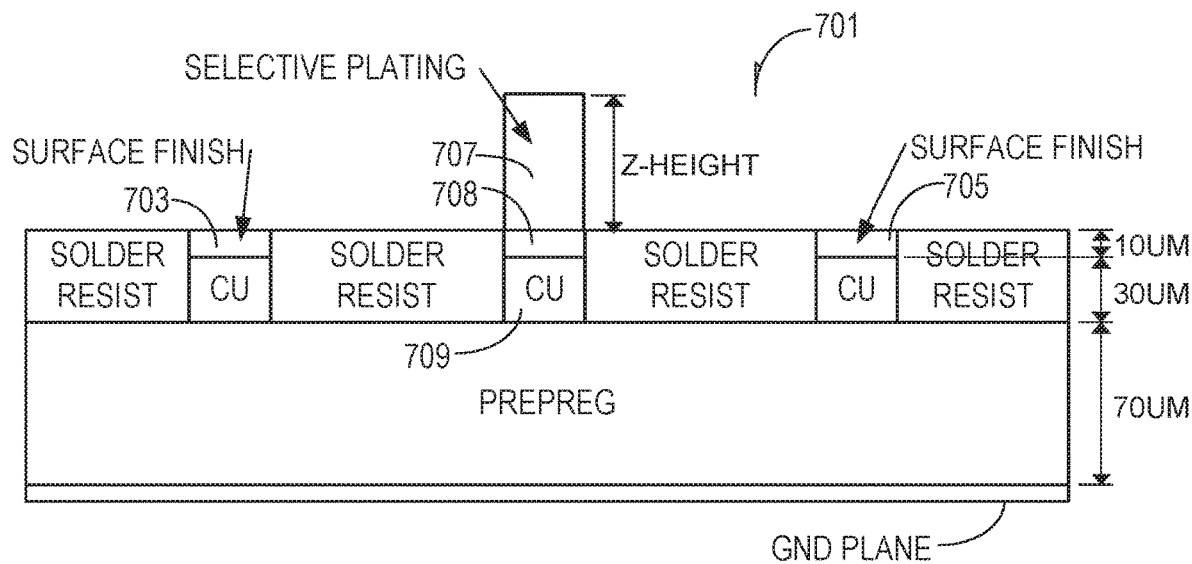
FIG. 7 illustrates additional process steps used to manufacture a printed circuit board with a protruded 3D GND fence, according to some embodiments.

FIG. 7 illustrates one or more additional process steps used to manufacture a printed circuit board with a 3D GND fence, according to some embodiments. FIG. 7 shows at 701 the one or more additional process step that can be used to manufacture the disclosed 3D GND fence in some embodiments. Prepreg is illustrated in this embodiment as 70 um in height, with the ground plane below the Prepreg. Aggressor trace 703, victim trace 705, and a third trace 708 that can be a 2D GND trace, were implemented, according to some embodiments. The 3D GND fence can be built on and contiguous with the 2D GND trace during the selective plating of the surface finish process using materials such as Electroless Nickel Immersion Gold (ENIG) or Hard Nickel Gold (HNG), which can be finished as were traces 703, 705. The materials may be applied to the finished 2D GND trace 708 to build the 3D fence with a targeted Z-height. As described above, the 3D GND fence will be exposed metal that protrudes above the solder resist layer. The GND plane is as illustrated and 703, 705, 707 may be connected to the GND plane as in FIGS. 3, 3A, but the connections are not shown in FIG. 7, for the purpose of clarity. Since the structure is electrically GND, the protrusion does not represent a shorting concern if it comes into human contact.

Figure 8:
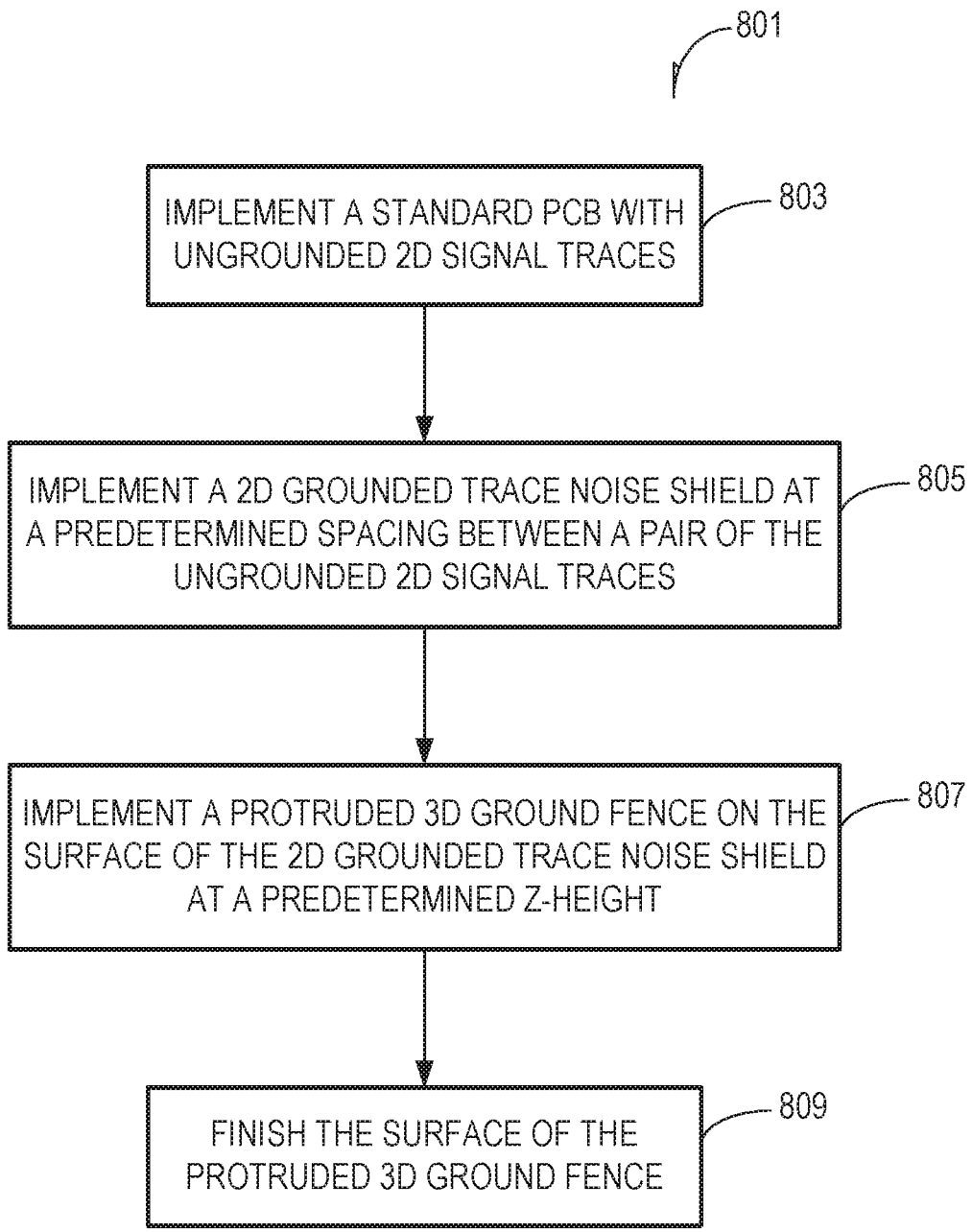
FIG. 8 is a flow chart that illustrates process steps useful in manufacturing a printed circuit board with a protruded 3D GND fence, according to some embodiments.

FIG. 8 is a flow chart 801 that illustrates process steps useful in manufacturing a printed circuit board with a 3D GND fence noise shielding, according to some embodiments. At 803 a standard PCB with 2D signal traces is implemented. As indicated at 805, a 2D grounded trace noise shield is implemented at a predetermined spacing between a pair of the 2D signal traces. Because a 3D GND fence will be implemented on the 2D GND tracing, the spacing distance would be the spacing distance used for a 3D GND fence as opposed to the greater spacing distance that would be used for a 2D grounded trace noise shield. At 807 a protruded 3D GND fence may be implemented on and contiguous with the 2D GND fence during the selective plating of the surface finish process for the PCB. The 3D GND fence may be implemented using materials such as Electroless Nickel Immersion Gold (ENIG) or Hard Nickel Gold (HNG) on the 2D GND trace, at a predetermined Z-height as is appropriate for the given embodiment. At 809 the surface of the protruded 3D GND fence may be finished according to usual semiconductor manufacturing practice.

Figure 9:
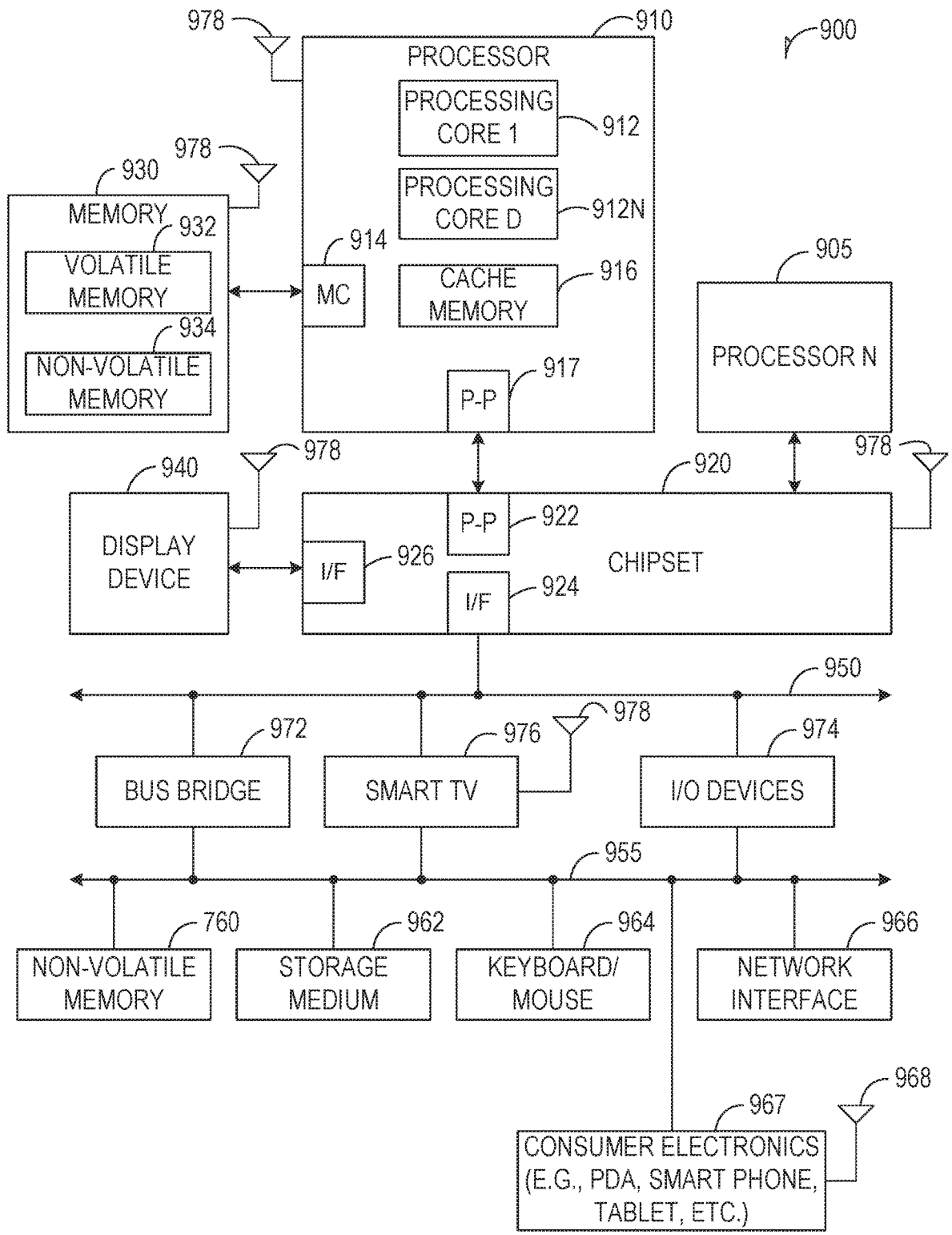
FIG. 9 illustrates an example machine in accordance with some embodiments.

FIG. 9 illustrates a system level diagram, depicting an example of an electronic device (e.g., system) including one or more integrated circuits that implement 3D GND fence ground-shielding crosstalk mitigation as described in the present disclosure. FIG. 9 is included to show an example of a higher level device application for integrated circuits employing phase and length matching using slow wave structures. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected embodiments of 916) can be incorporated into processor core 912.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Examples

Example 1 is a printed circuit board (PCB), comprising: a dielectric plane; a ground plane parallel to and spaced apart from the dielectric plane; a pair of signal traces located parallel to each other on the dielectric plane; and a 3-dimensional (3D) grounded (GND) fence located on the dielectric plane between the pair of signal traces, and protruding perpendicularly from the dielectric plane to a height greater than the height of the pair of signal traces, wherein the 3D GND fence is configured to block electromagnetic interference (EMI) from a first of the pair of signal traces to a second of the pair of signal traces.

In Example 2, the subject matter of Example 1 optionally includes wherein the pair of signal traces is configured to form part of a noise-sensitive clock circuit.

In Example 3, the subject matter of any one or more of Examples 1-2 optionally include D GND fence is electrically connected to the ground plane.

In Example 4, the subject matter of any one or more of Examples 1-3 optionally include D GND fence has a rectangular configuration parallel to the dielectric plane and a height dimension perpendicular to the dielectric plane.

In Example 5, the subject matter of any one or more of Examples 1-4 optionally include D GND fence is electrically connected to the ground plane by a via.

In Example 6, the subject matter of Example 5 optionally includes D GND fence is greater than a diameter of the circular cross section.

In Example 7, the subject matter of any one or more of Examples 1-6 optionally include D GND fence is located equidistant from each of the pair of signal traces.

In Example 8, the subject matter of any one or more of Examples 1-7 optionally include D GND fence perpendicular to the dielectric plane is no greater than the perpendicular dimension of the electronic component that has the greatest dimension perpendicular to the dielectric plane.

In Example 9, the subject matter of any one or more of Examples 1-8 optionally include D GND fence perpendicular to the dielectric plane is greater than the perpendicular dimension of the electronic component that has the greatest dimension perpendicular to the dielectric plane.

Example 10 is a printed circuit board (PCB), comprising: a dielectric plane; a ground plane parallel to and spaced apart from the dielectric plane; a pair of signal traces located parallel to each other on the dielectric plane, the signal traces having a dimension perpendicular to the dielectric plane; a 2-dimensional (2D) grounded (GND) signal trace located on the dielectric plane between the pair of signal traces; and a 3-dimensional (3D) grounded (GND) fence located on and contiguous with the 2D GND signal trace, and protruding perpendicularly from the dielectric plane, wherein the 3D GND fence is configured to block electromagnetic interference (EMI) from a first of the pair of signal traces to a second of the pair of the signal traces.

In Example 11, the subject matter of Example 10 optionally includes wherein the pair of signal traces is configured to form part of a noise-sensitive electronic circuit.

Example 12 is a computer processor comprising: one or more processor cores; memory; and a memory controller, wherein the one or more processor cores, memory, and memory controller each includes: a printed circuit board (PCB) comprising: a dielectric plane; a ground plane parallel to and spaced from the dielectric plane; a pair of signal traces located parallel to each other on the dielectric plane; and a 3-dimensional (3D) grounded (GND) fence located between the pair of signal traces, and protruding perpendicularly from the dielectric plane, wherein the 3D GND fence is configured to block electromagnetic interference (EMI) from a first of the pair of signal traces and a second of the pair of the signal traces.

In Example 13, the subject matter of Example 12 optionally includes wherein the pair of signal traces is configured to form part of a noise-sensitive electronic circuit.

In Example 14, the subject matter of any one or more of Examples 12-13 optionally include D GND fence is electrically connected to the ground plane.

In Example 15, the subject matter of any one or more of Examples 12-14 optionally include D GND fence has a rectangular configuration parallel to the dielectric plane and a height dimension perpendicular to the dielectric plane.

In Example 16, the subject matter of any one or more of Examples 12-15 optionally include D GND fence is electrically connected to the ground plane by a through-semiconductor via.

In Example 17, the subject matter of Example 16 optionally includes D GND fence is greater than a diameter of the circular cross section.

In Example 18, the subject matter of any one or more of Examples 12-17 optionally include D GND fence is located equidistant from each of the pair of signal traces.

In Example 19, the subject matter of any one or more of Examples 12-18 optionally include D GND fence perpendicular to the dielectric plane is no greater than the perpendicular dimension of the electronic component that has the greatest dimension perpendicular to the dielectric plane.

In Example 20, the subject matter of any one or more of Examples 12-19 optionally include the D GND fence perpendicular to the dielectric plane is greater than the perpendicular dimension of the electronic component that has the greatest dimension perpendicular to the dielectric plane.

In Example 21, the subject matter of any one or more of Examples 12-20 optionally include the pair of signal traces is configured to form part of a noise-sensitive clock circuit.

In Example 22, the subject matter can include, or can optionally be combined with any portion or combination of, any portions of any one or more of Examples 1 through 21 to include, subject matter that can include means for performing any one or more of the functions of Examples 1 through 21, or a machine-readable medium including instructions that, when performed by a machine, cause the machine to perform any one or more of the functions of Examples 1 through 21.

All features of the apparatuses described above (including optional features) may also be implemented with respect to the methods or processes described herein.

What is claimed is:
1. A printed circuit board (PCB), comprising:
a dielectric plane;
a ground plane parallel to and spaced apart from the dielectric plane;
a pair of signal traces located parallel to each other on the dielectric plane;
a 3-dimensional (3D) grounded (GND) fence located on the dielectric plane between the pair of signal traces, and protruding perpendicularly from the dielectric plane to a height greater than the height of the pair of signal traces, wherein the 3D GND fence is configured to block electromagnetic interference (EMI) from a first of the pair of signal traces to a second of the pair of signal traces; and a first via electrically connecting the 3D GND fence with the ground plane, wherein the first via has a first cross-sectional dimension; and a second via coupled to the first of the pair of signal traces, wherein the second via has a second cross-sectional dimension, and the first cross-sectional dimension is less than the second cross-sectional dimension.

2. The PCB of claim 1 wherein the pair of signal traces is configured to form part of a noise-sensitive clock circuit.

3. The PCB of claim 1 wherein the 3D GND fence is electrically connected to the ground plane.

4. The PCB of claim 1 wherein the 3D GND fence has a rectangular configuration parallel to the dielectric plane and a height dimension perpendicular to the dielectric plane.

5. The PCB of claim 1 wherein the first via has a circular cross section and a width dimension of the 3D GND fence is greater than a diameter of the circular cross section.

6. The PCB of claim 1 wherein the 3D GND fence is located equidistant from each of the pair of signal traces.

7. The PCB of claim 1 wherein the dielectric plane includes a plurality of electronic components each with a dimension perpendicular to the dielectric plane, and the protrusion of the 3D GND fence perpendicular to the dielectric plane is no greater than the perpendicular dimension of the electronic component that has the greatest dimension perpendicular to the dielectric plane.

8. The PCB of claim 1 wherein the dielectric plane includes a plurality of electronic components each with a dimension perpendicular to the dielectric plane, and the protrusion of the 3D GND fence perpendicular to the dielectric plane is greater than the perpendicular dimension of the electronic component that has the greatest dimension perpendicular to the dielectric plane.

9. A printed circuit board (PCB), comprising:
a dielectric plane;
a ground plane parallel to and spaced apart from the dielectric plane;
a pair of signal traces located parallel to each other on the dielectric plane, the signal traces having a dimension perpendicular to the dielectric plane;
a 2-dimensional (2D) grounded (GND) signal trace located on the dielectric plane between the pair of signal traces; and
a 3-dimensional (3D) grounded (GND) fence located on and contiguous with the 2D GND signal trace, and protruding perpendicularly from the dielectric plane to a height greater than the height of the pair of signal traces and greater than the height of the 2D GND signal trace, wherein the 3D GND fence is configured to block electromagnetic interference (EMI) from a first of the pair of signal traces to a second of the pair of the signal traces;
a first via electrically connecting the 3D GND fence with the ground plane, wherein the first via has a first cross-sectional dimension; and
a second via coupled to a first of the pair of signal traces, wherein the second via has a second cross-sectional dimension, and the first cross-sectional dimension is less than the second cross-sectional dimension.

10. The PCB of claim 9 wherein the pair of signal traces is configured to form part of a noise-sensitive electronic circuit.

11. A computer processor comprising:
one or more processor cores;
memory; and
a memory controller, wherein the one or more processor cores, memory, and memory controller each includes:
a printed circuit board (PCB) comprising:
a dielectric plane;
a ground plane parallel to and spaced from the dielectric plane;
a pair of signal traces located parallel to each other on the dielectric plane;
a 3-dimensional (3D) grounded (GND) fence located between the pair of signal traces, and protruding perpendicularly from the dielectric plane, wherein the 3D GND fence is configured to block electromagnetic interference (EMI) from a first of the pair of signal traces and a second of the pair of the signal traces;
a first via electrically connecting the 3D GND fence with the ground plane, wherein the first via has a first cross-sectional dimension; and
a second via coupled to a first of the pair of signal traces, wherein the second via has a second cross-sectional dimension, and the first cross-sectional dimension is less than the second cross-sectional dimension.

12. The computer processor of claim 11 wherein the pair of signal traces is configured to form part of a noise-sensitive electronic circuit.

13. The computer processor of claim 11 wherein the PCB further comprises a ground plane parallel to and spaced apart from the dielectric plane, and the 3D GND fence is electrically connected to the ground plane.

14. The computer processor of claim 11 wherein the 3D GND fence has a rectangular configuration parallel to the dielectric plane and a height dimension perpendicular to the dielectric plane.

15. The computer processor of claim 11 wherein the first via has a circular cross section and a width dimension of the 3D GND fence is greater than a diameter of the circular cross section.

16. The computer processor of claim 11 wherein the 3D GND fence is located equidistant from each of the pair of signal traces.

17. The computer processor of claim 11 wherein the dielectric plane includes a plurality of electronic components each with a dimension perpendicular to the dielectric plane, and the protrusion of the 3D GND fence perpendicular to the dielectric plane is no greater than the perpendicular dimension of the electronic component that has the greatest dimension perpendicular to the dielectric plane.

18. The computer processor of claim 11 wherein the dielectric plane includes a plurality of electronic components each with a dimension perpendicular to the dielectric plane, and the protrusion of the 3D GND fence perpendicular to the dielectric plane is greater than the perpendicular dimension of the electronic component that has the greatest dimension perpendicular to the dielectric plane.

* * * * *